United States Patent
Sanji (10) Patent No.: US 10,426,070 B2
(45) Date of Patent: Sep. 24, 2019

(54) METHOD OF MOUNTING COMPONENT ON TO SUBSTRATE IN COMPONENT MOUNTING DEVICE AND COMPONENT MOUNTING DEVICE

(71) Applicant: FUJI CORPORATION, Chiryu (JP)

(72) Inventor: Mitsuru Sanji, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 600 days.

(21) Appl. No.: 14/903,488

(22) PCT Filed: Jul. 12, 2013

(86) PCT No.: PCT/JP2013/069214
§ 371 (c)(1),
(2) Date: Jan. 7, 2016

(87) PCT Pub. No.: WO2015/004813
PCT Pub. Date: Jan. 15, 2015

(65) Prior Publication Data
US 2016/0174424 A1 Jun. 16, 2016

(51) Int. Cl.
*H05K 13/04* (2006.01)
*H05K 3/30* (2006.01)

(52) U.S. Cl.
CPC .......... *H05K 13/0404* (2013.01); *H05K 3/30* (2013.01); *H05K 13/0408* (2013.01); *H05K 13/0413* (2013.01)

(58) Field of Classification Search
CPC .......... Y10T 29/4913; Y10T 29/53174; Y10T 29/53183; Y10T 29/49139; H05K 13/0404; H01R 43/205
See application file for complete search history.

(56) References Cited

U.S. PATENT DOCUMENTS

| 4,865,375 A * | 9/1989 | Laub .................... B25J 15/0253 29/741 |
| 9,699,945 B2 * | 7/2017 | Ishitani .............. H05K 13/0408 |
| 2010/0013464 A1 | 1/2010 | De Huu et al. |

FOREIGN PATENT DOCUMENTS

| JP | 2010-027611 A | 2/2010 |
| JP | 2010-027661 A | 2/2010 |
| JP | 2010027661 A * | 2/2010 |

OTHER PUBLICATIONS

International Search Report dated Sep. 10, 2013 for PCT/JP2013/069214 filed on Jul. 12, 2013.

* cited by examiner

*Primary Examiner* — Livius R. Cazan
(74) *Attorney, Agent, or Firm* — Oblon, McClelland, Maier & Neustadt, L.L.P.

(57) ABSTRACT

The method for assembling a component on a board is configured by a transfer pressing step that assembles a target gripping location of a component by gripping the target gripping location using a component transfer device, performing positioning, and applying a pressing force to a board side, and a pressing step that simultaneously assembles each corresponding portion of the component by positioning at least two holding claws of a component gripping device in predetermined positions, and applying a pressing force to the component on the board side using each holding claw.

8 Claims, 9 Drawing Sheets

METHOD OF MOUNTING COMPONENT ON TO SUBSTRATE IN COMPONENT MOUNTING DEVICE AND COMPONENT MOUNTING DEVICE

TECHNICAL FIELD

The present invention relates to a method for assembling a component on a board in a component assembly apparatus that assembles a component on a board, which is positioned in a stop position, by holding the component using a component transfer device, and a component assembly apparatus.

BACKGROUND ART

The technologies that are shown in PTL 1 are known as a method for assembling a component on a board in a component assembly apparatus and a component assembly apparatus. As shown in FIG. 1 of PTL 1, the method for assembling a component on a board in a component assembly apparatus assembles a comparatively large electronic component 11, which has a plurality of pins 15, by holding the electronic component 11 using a component holder (a chuck 12), and respectively press-fitting each pin 15 of the electronic component 11 to a plurality of positioning holes 16 of a circuit board 13. For example, in a case of an electronic component 11 in which the pins 15 are provided in three locations of a central section and both end sections, firstly, the central section of the electronic component 11 is assembled by holding the central section of the electronic component 11 using the chuck 12 of the component holder, moving the central section of the electronic component 11 over a position of the circuit board 13, which is positioned in a stop position, at which the electronic component is assembled, and press-fitting the pin 15 of the central section of the electronic component 11 to a positioning hole 16 of a central section of the circuit board 13 by pushing the pin 15 down, the chuck 12 is subsequently released, the component holder is moved over a first end side of the electronic component 11 by raising the component holder, the first end side of the electronic component 11 is assembled by press-fitting a pin of the first end side of the electronic component 11 to a corresponding positioning hole 16 of the first end side of the circuit board 13 as a result of pushing the component holder down, the component holder is moved over a second end side of the electronic component 11 by raising the component holder again, and the second end side of the electronic component 11 is assembled by press-fitting a pin 15 of the second end side of the electronic component 11 to a corresponding positioning hole 16 of the second end side of the circuit board 13 as a result of pushing down (paragraphs [0014] to [0020]). According to this configuration, it is possible to assemble a plurality of types of electronic components with different dimensions, shapes, pin numbers and positions on a circuit board using one type of component holder.

CITATION LIST

Patent Literature

PTL 1: JP-A-2010-27661

SUMMARY

Problem to be Solved

In a technique that assembles a component on a board in the component assembly apparatus that is disclosed in the abovementioned PTL 1, in a case in which an electronic component is comparatively large, since, after assembling a central section of the electronic component by press-fitting a pin of the central section of the electronic component to a positioning hole of a central section of a circuit board, it is necessary to press-fitting both ends separately (two steps), there are a large number of press-fitting actions, and therefore, a cycle time that is required in order to assemble a component on the circuit board is increased, and productivity is decreased.

The present disclosure was devised in consideration of the abovementioned circumstances, and an object thereof is to improve productivity by reducing a cycle time that is required in order to assemble a component on a board as a result of reducing a number of repetitions of a pressing step in order to assemble each assembly location at each corresponding position of the board.

Means for Solving the Problem

In order to solve the abovementioned technical problem, a method for assembling a component on a board in a component assembly apparatus according to the present disclosure, which is provided with a component transfer device that includes at least two holding claws, which grip a component, opening and closing control of which is performed by a driving device, and that assembles the component by gripping the component using the holding claws and moving the component to an assembly position of the board, which is positioned in a stop position, includes a transfer pressing step that assembles a portion of the component that corresponds to a target gripping location on the board by applying a pressing force toward a board side after moving the component above the assembly position in a state in which the target gripping location of the component is gripped by the holding claws, and a pressing step that assembles each portion of the component that corresponds to a pressing force position by each holding claw on the board by applying a pressing force to the component toward the board side using the holding claws, opening and closing control of which is performed by the driving device, and which are positioned in predetermined positions that differ from positions at which the target gripping location is gripped after the transfer pressing step. According to this configuration, it is possible to improve productivity by reducing a cycle time that is required in order to assemble a component on a board.

DESCRIPTION OF EMBODIMENTS

1) First Embodiment

Figure 1:
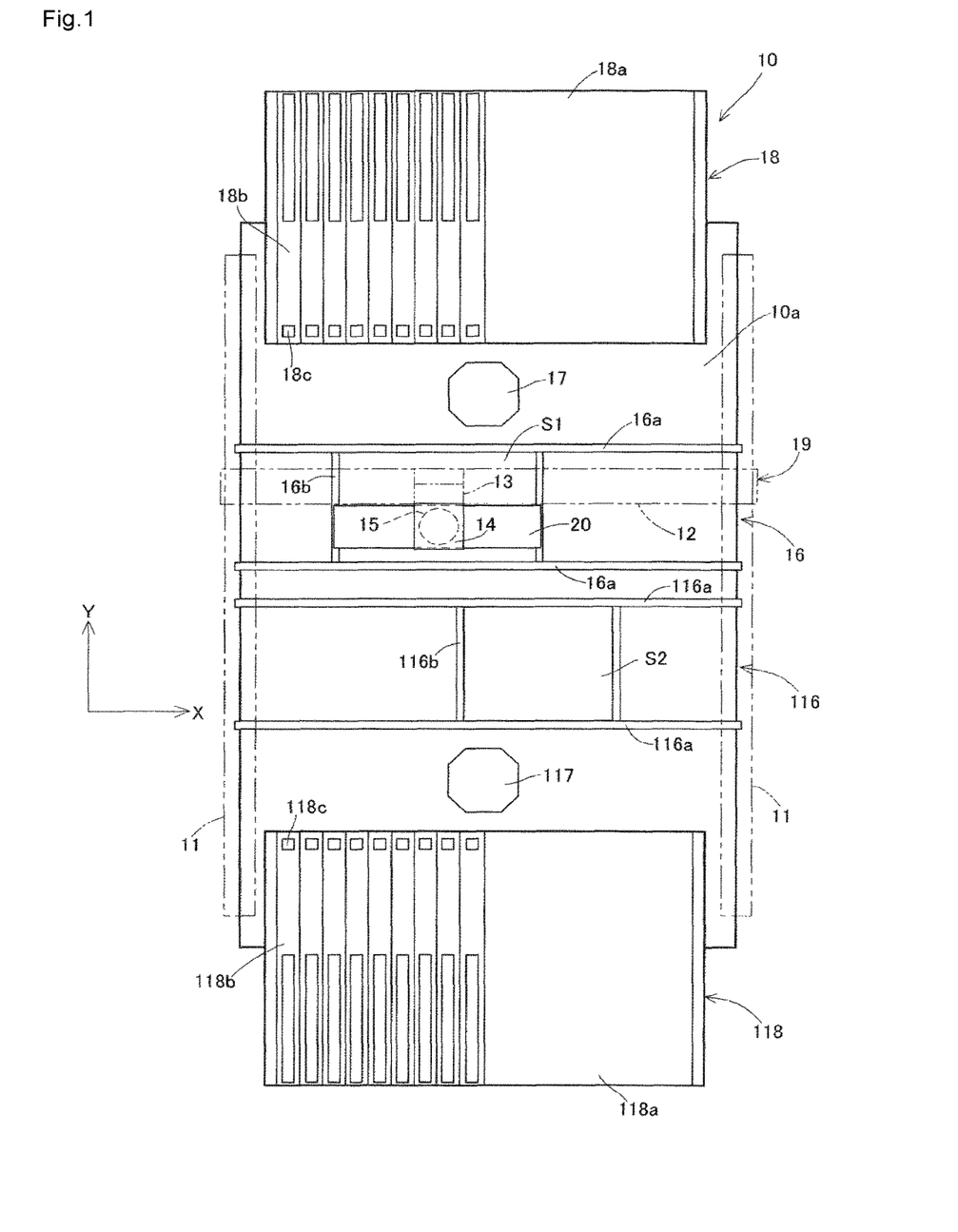
FIG. 1 is a plan view that shows an overall configuration of a first embodiment of a component assembly apparatus according to the present disclosure.

Hereinafter, a first embodiment of a method for assembling a component on board in a component assembly apparatus and component assembly apparatus according to the present embodiment will be described. FIG. 1 is a plan view that shows a component assembly apparatus. In a component assembly apparatus 10, first and second board conveyance lanes 16 and 116, which include guide rails 16a and 116a on both sides thereof, are disposed in a central section on a base platform 10a, which is disposed in a vertically long manner, lined up above and below in a laterally-facing manner (along an X axis direction). First and second back-up devices 16b and 116b, which respectively support positioning of boards S1 and S2, are provided in each board conveyance lane 16 and 116.

In FIG. 1, first and second component supply devices 18 and 118 are respectively disposed on upper sides of positions, which are in an upper section and a lower section of the base platform 10a, and tray-type supply units 18a and 118a, and cassette-type feeders 18b and 118b, which supply a component 30, which will be described later, are provided in each component supply device 18 and 118. Comparatively large components are accommodated lined up in the tray-type supply units 18a and 118a, comparatively small components are accommodated in the cassette-type feeders 18b and 118b, and are fed to component unloading sections 18c and 118c one at a time.

A component transfer device 19, which assembles a defined component 30 by moving in an X axis and a Y axis, which are horizontally orthogonal with one another, and a Z axis directions, which is perpendicular to the X axis and the Y axis, transferring the component 30 from inside each component supply device 18 and 118 to each board S1 and S2 by gripping and retrieving the component 30 using a pair of holding claws 25, and applying a pressing force to a defined location of the component 30, is provided above both back-up devices 16b and 116b. In addition, first and second imaging devices 17 and 117 for confirming the component 30 that is gripped by the holding claws 25 of a component gripping device 20, are provided between the first board transport lane 16 and the first component supply device 18; and between the second board conveyance lane 116 and the second component supply device 118.

Figure 2:
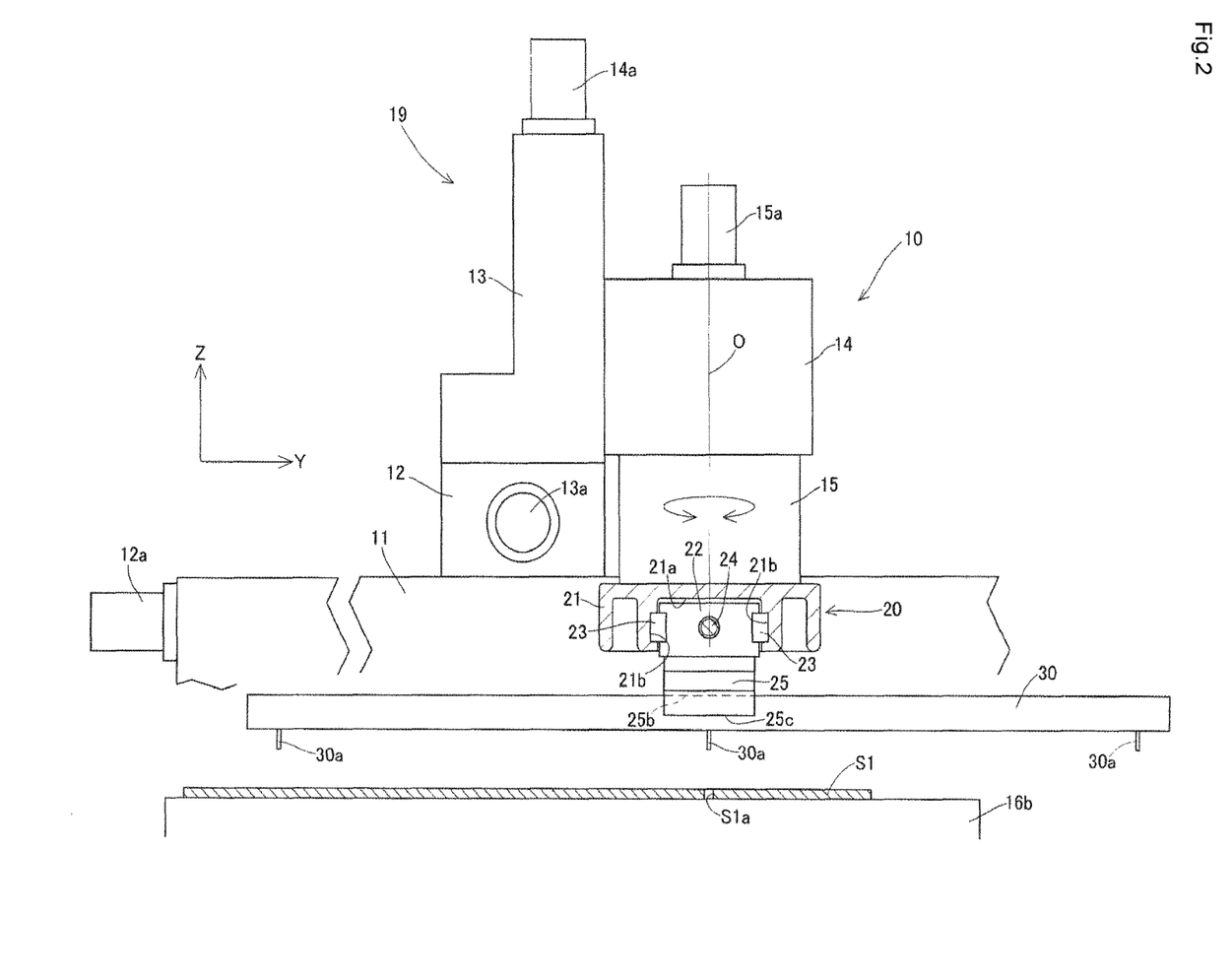
FIG. 2 is a side view of the main parts of the component assembly apparatus of the first embodiment that is shown in FIG. 1 in a state in which a component is gripped by a component transfer device.

Next, the component transfer device 19, which moves in the X axis, Y axis and Z axis directions, and the component gripping device 20, which is provided in the component transfer device 19, and is provided with the holding claws 25, which grip the component 30, will be described primarily using FIGS. 1 to 3. As shown in FIGS. 1 and 2, the component transfer device 19 is an XY robot type device, and is provided with a Y axis slider 12, an X axis slider 13, and a lifting and lowering member 14.

More specifically, as shown in FIGS. 1 and 2, both end sections of the Y axis slider 12, which is orthogonal to a pair of guide members 11 that are fixed along the Y axis direction on both sides of the base platform 10a of the component assembly apparatus 10, and which extends in the X axis direction, are supported on the guide members 11 in a manner in which the Y axis slider 12 is capable of freely sliding in the Y axis direction, and the movement of the Y axis slider 12 is controlled by a Y-axis motor 12a. The X axis slider 13, which stands upright, is supported on the Y axis slider 12 in a manner in which the X axis slider 13 is capable of freely sliding in the X axis direction, and the movement of the X axis slider 13 is controlled by an X-axis motor 13a. The lifting and lowering member 14 is supported on a side of the X axis slider 13 in a manner in which the lifting and lowering member 14 is capable of freely sliding in the perpendicular Z axis direction, and the ascending and descending of the lifting and lowering member 14 is controlled by a Z-axis motor 14a. In addition, a rotating member 15 is supported on a bottom face of the lifting and lowering member 14 in a manner in which the rotating member 15 is capable of freely rotating around an axial line O, which is parallel to the Z axis, and the rotation thereof is controlled by a θ-axis motor 15a.

A main body section 21 of the long and thin component gripping device 20, which includes the pair of holding claws 25 that grip the component 30 on a lower side thereof, is fixed to a bottom face of the rotating member 15 so as to be orthogonal to the axial line O. A substantially U-shaped central groove 21a, a lower side of which is open, is formed on the bottom face of the main body section 21, and a pair of substantially U-shaped guide grooves 21b and 21b, which are open on inner sides thereof, are formed on both inner side surfaces of the central groove 21a that face one another. The main body section 21 is sealed in a fixed cross-sectional shape across the entire length thereof in a longitudinal direction as a result of both ends thereof being sealed by end surface plates 21c and 21d. A single feed screw shaft 24 is provided in a central section inside the central groove 21a across the entire length thereof in the longitudinal direction, both ends of the feed screw shaft 24 are supported by each end surface plate 21c and 21d in a manner in which the feed screw shaft 24 is capable of freely rotating, and the rotation of the feed screw shaft 24 is controlled by a feed motor 24c, which is provided on one of the end surface plates 21c. A right screw section 24a and a left screw section 24b are formed on the outer periphery of the feed screw shaft 24 with a central section thereof in the longitudinal direction set as a boundary therebetween.

Two square block-shaped needles 22 are guided and supported by the guide grooves 21b and 21b inside the central groove 21a of the main body section 21 in a manner in which the needles 22 are capable of freely moving through each of two linear guides 23 in the longitudinal direction. Each of the needles 22 and 22 are respectively screw-engaged together with the right screw section 24a and the left screw section 24b of the feed screw shaft 24. The two holding claws 25 of the same shape are attached to the bottom face of each needle 22 and 22 so as to protrude downward from the bottom face of the main body section 21 in a manner in which the holding claws 25 are capable of being attached and detached with respect to one another. Press-down stepped portions 25b and 25b, which are positioned on the same horizontal plane, and gripping surfaces 25a and 25a, which are orthogonal to the press-down stepped portions 25b and 25b, mutually face one another, and extend downward in a parallel manner, are formed on mutually facing sides of the lower halves of each holding claw 25 and 25. The back surface of the gripping surface 25a of each holding claw 25 and 25 is an inclined surface, the thickness of which gradually becomes thinner toward the tip end thereof, and narrow tip end surfaces 25c, which are positioned on the same horizontal plane, are formed on the lower end of each holding claw 25 and 25.

If the feed screw shaft 24 is rotated by the feed motor 24c, each needle 22 and 22, and the holding claws 25 and 25, which are anchored thereto, are moved backwards in an interlocked manner and are opened and closed depending on a rotation direction of the rotation. The needles 22 and 22, the feed screw shaft 24 and the feed motor 24c configure a driving device A that performs opening and closing control of the two holding claws 25. In this embodiment, the holding claws 25 and 25 are opened and closed from positions at which both needles 22 and 22 abut against one another in a central section of the main body section 21, to positions that are shown by two-dotted chain lines 25A and 25A in FIG. 3 at which each needle 22 and 22 respectively abuts against each end surface plate 21c and 21d of the main body section 21.

Additionally, in the component gripping device 20 of the embodiment, each holding claw 25 and 25 is opened and closed in an interlocked manner by a single feed screw shaft 24, in which the right screw section 24a and the left screw section 24b are provided. However, the driving device A may be configured so that each holding claw 25 and 25, which is anchored to each needle, moves as a result of a single needle being respectively driven by two feed screw shafts, which are respectively driven by a single feed motor. According to such a component gripping device, since, as long as each needle and the holding claws 25 and 25 do not abut against and interfere with one another, each holding claw 25 and 25 can move freely independent of the other, the degrees of freedom of the action of the component gripping device is improved. In addition, the driving device A of the holding claws 25 is shown as a driving device that drives using a feed screw mechanism, but the mechanism may be substituted with a mechanism that drives using a linear motor.

Figure 4:
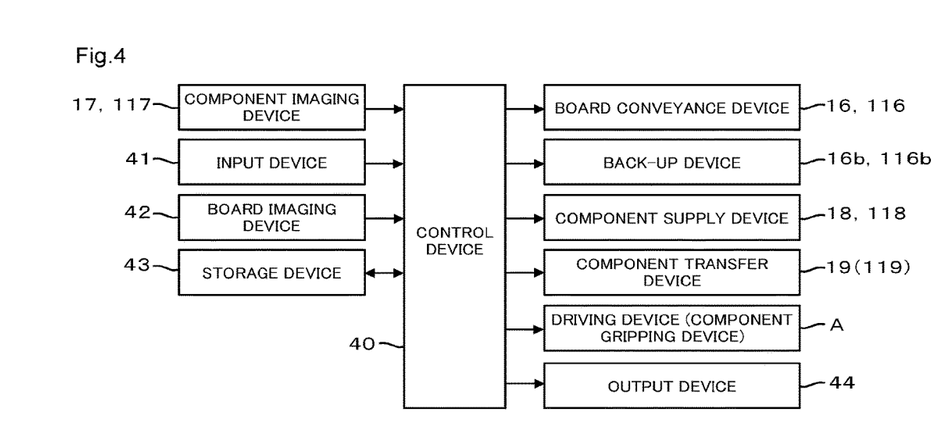
FIG. 4 is functional block diagram that shows the component assembly apparatus that is shown in FIG. 1.

The component assembly apparatus 10 is provided with a control device 40. As shown in FIG. 4, the control device 40 is connected to an input device 41, the component imaging devices 17 and 117, a board imaging device 42, a storage device 43, the board conveyance devices 16 and 116, the back-up devices 16b and 116b, the component supply devices 18 and 118, the component transfer devices 19 (and 119), the driving device A of the component gripping device 20 and an output device 44. The input device 41 is provided with an initiation switch, which initiates operation of the component assembly apparatus 10, a stop switch, which stops operation of the component assembly apparatus 10, and the like. The storage device 43 stores a system program, which controls the entire component assembly apparatus 10, a control program, which respectively controls each element of the devices individually under the control of the system program, and the like. The output device 44 displays status information of the component assembly apparatus 10, warnings, instructions to an operator, and the like.

Figure 5:
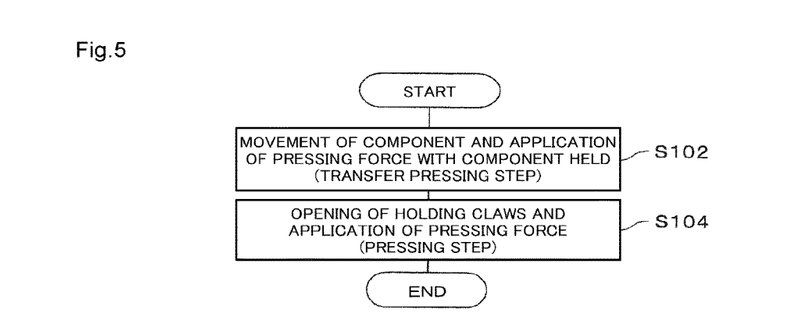
FIG. 5 is flowchart that describes a method for assembling a component on a board in a component assembly apparatus using a control device that is shown in FIG. 4.

Next, the actions (a technique) of a case in which an electronic component 30 such as a connector that is inserted into a memory board or the like, which is long and comparatively large, and is made from a synthetic resin, is assembled on a circuit board S1 by the component assembly apparatus 10 that is mentioned above, will be described with reference to the flowchart of FIG. 5. In the embodiment, three pairs of pins 30a (two pins 30a per pair) are provided in a straight line protruding at regular intervals on a lower surface of the long and thin component 30, and three pairs of positioning holes S1a, which correspond to the three pairs of pins 30a at assembly positions of the component 30, are provided penetrating through the board S1, on which the component 30 is to be assembled. The board S1, which is transported to a predetermined mounting position by the first board conveyance lane 16, is pushed up, positioned and supported by a plurality of pins of the first back-up device 16b.

Firstly, in Step S102 (the transfer pressing step and the transfer pressing section), the control device 40 moves the component gripping device 20 above the tray-type supply unit 18a, for example, lowers the component gripping device 20, and unloads the component 30 by gripping a predetermined target gripping location (in the present embodiment, a central section that corresponds to a central pin 30a) of a single component 30 using each gripping surface 25a and 25a of the two holding claws 25 and 25 of the component gripping device 20, opening and closing control of which is performed by the driving device A. The gripping is performed by gripping both side surfaces of the target gripping location of the component 30 using the gripping surfaces 25a and 25a of each holding claw 25 and 25 in a state in which the press-down stepped portions 25b and 25b of each holding claw 25 and 25 abuts against an upper surface of the target gripping location of the component 30.

Figure 3:
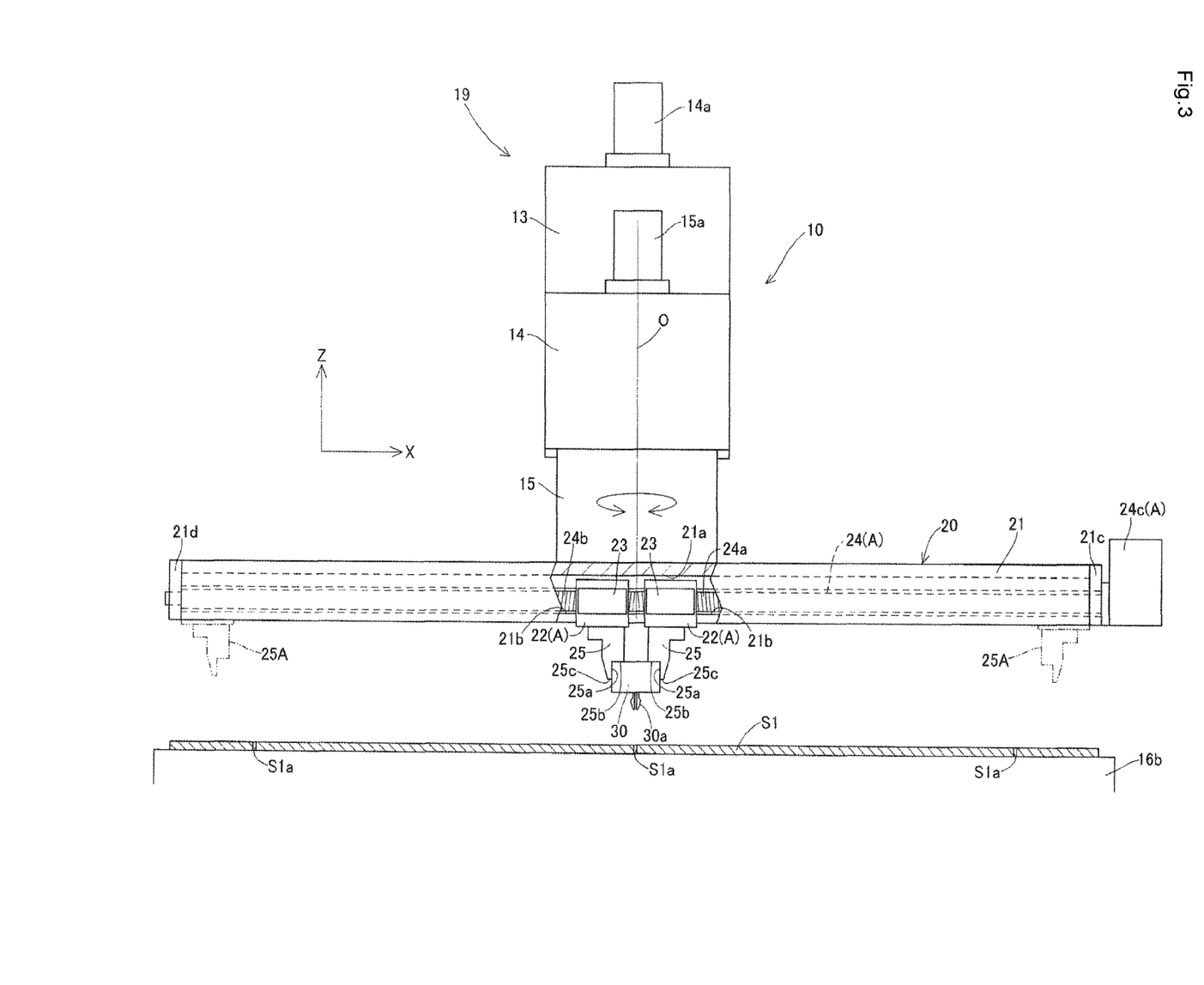
FIG. 3 is a front view of the main parts of the component assembly apparatus of the first embodiment that is shown in FIG. 1 in the state that is shown in FIG. 2.
Figure 6:
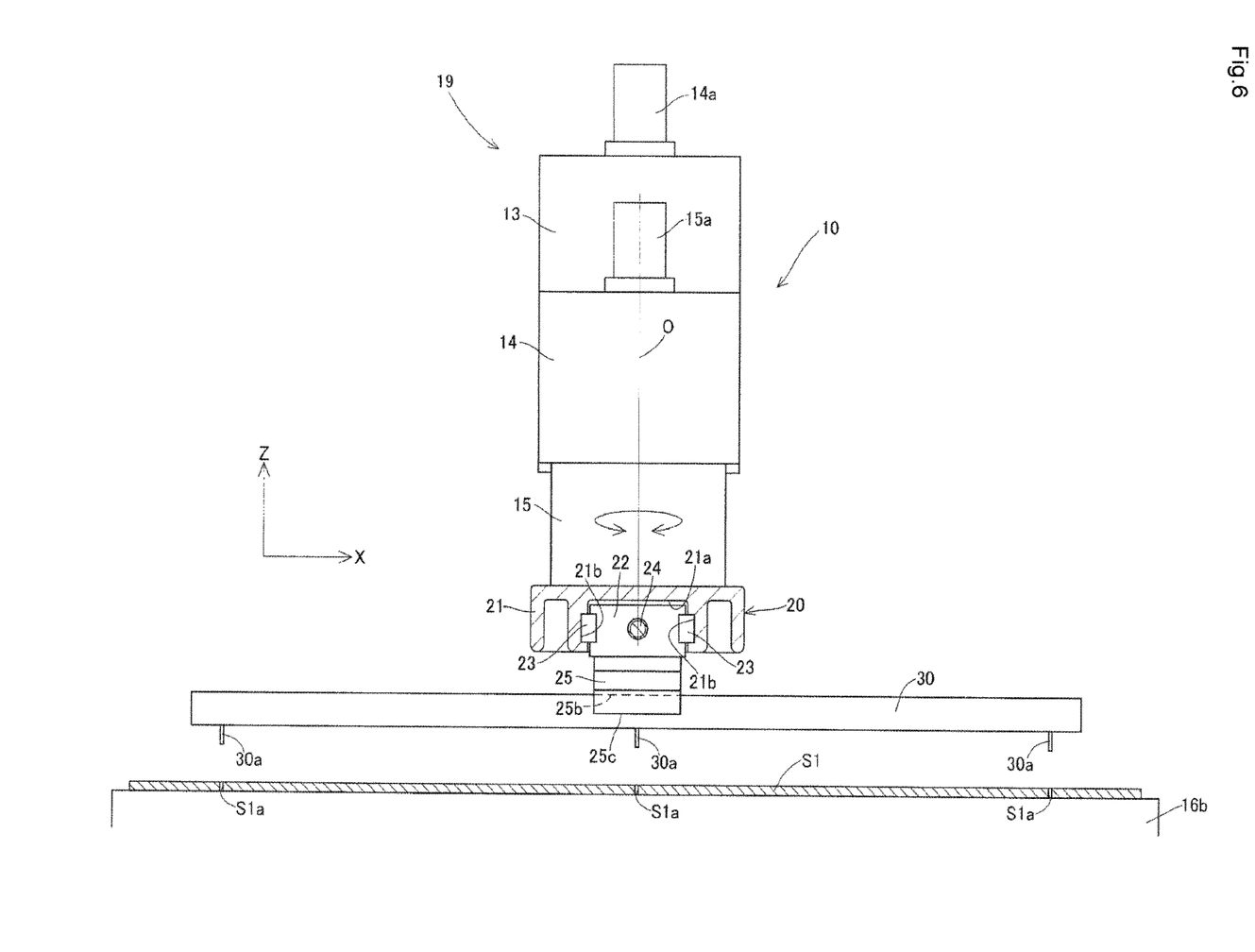
FIG. 6 is a front view of the main parts of the component assembly apparatus in a state in which the component transfer device is rotated 90° in FIG. 3.

The control device 40 raises the component gripping device 20, which is gripping the component 30, and moves the component gripping device 20 above the board S1, which is positioned and supported on the first back-up device 16b, by moving the component gripping device 20 in an X direction and a Y direction (refer to FIGS. 2 and 3). Further, the control device 40 rotates the component gripping device 20 by 90° using the θ-axis motor 15a, and performs positioning of the component gripping device 20 by moving the component gripping device 20 to a predetermined position at which the three pairs of pins 30a of the component 30 are aligned with the three pairs of positioning holes S1a of the board S1, which is positioned and supported on the first backup device 16b (refer to FIG. 6).

Figure 7:
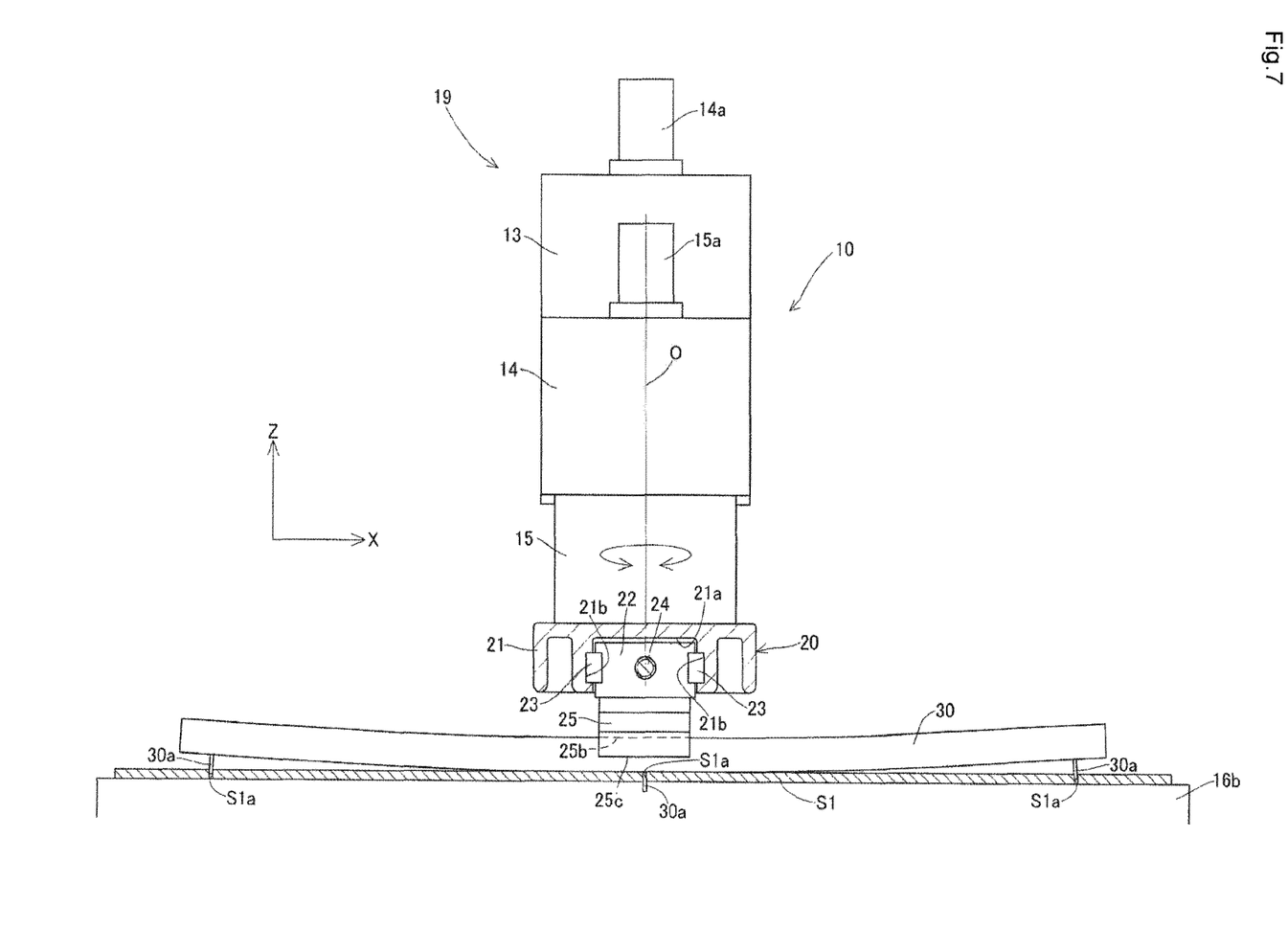
FIG. 7 is a similar front view to that of FIG. 6 of the main parts of the component assembly apparatus in a state in which a transfer pressing step is completed as a result of the component transfer device being lowered.

The control device 40 lowers the component gripping device 20 in this state, applies a pressing force to the upper surface of the target gripping location of the component 30 using the press-down stepped portions 25b and 25b of the holding claws 25 and 25, and press-fits a pair of pins (central pins 30a) of the component 30, which correspond to the target gripping location of the component 30 by the holding claws 25 and 25, to a corresponding pair of positioning holes (central positioning holes S1a) of the board S1 (refer to FIG. 7).

The transfer pressing step is completed as a result of this, and in this state, a lower surface in the vicinity of a central section of the component 30, which is the target gripping location of the component 30 by the holding claws 25 and 25, completely abuts against the upper surface of an assembly position that corresponds to the board S1 in a practical sense, and the central pins 30a of the component 30 are also assembled as a result of being completely inserted into the corresponding central positioning holes S1a of the board S1. However, both side sections of the long component 30, which is made from a synthetic resin, lift up from the upper surface of the board S1 as a result of being bent due to friction resistance between each pin 30a and 30a of the both side sections, and each corresponding positioning hole S1a and S1a of the both side sections of the board S1, and each pin 30a and 30a of the both side sections of the board S1 is not completely inserted into the positioning holes S1a and S1a of both side sections. Additionally, the central pins 30a of the component 30, which is the target gripping location of the component 30, are equivalent to "a portion that corresponds to the target gripping location of the component". The portion that corresponds to the target gripping location of the component is a portion of the component in which the component is assembled on the board when a pressing force is applied to the component in a state in which the target gripping location is held.

Figure 8:
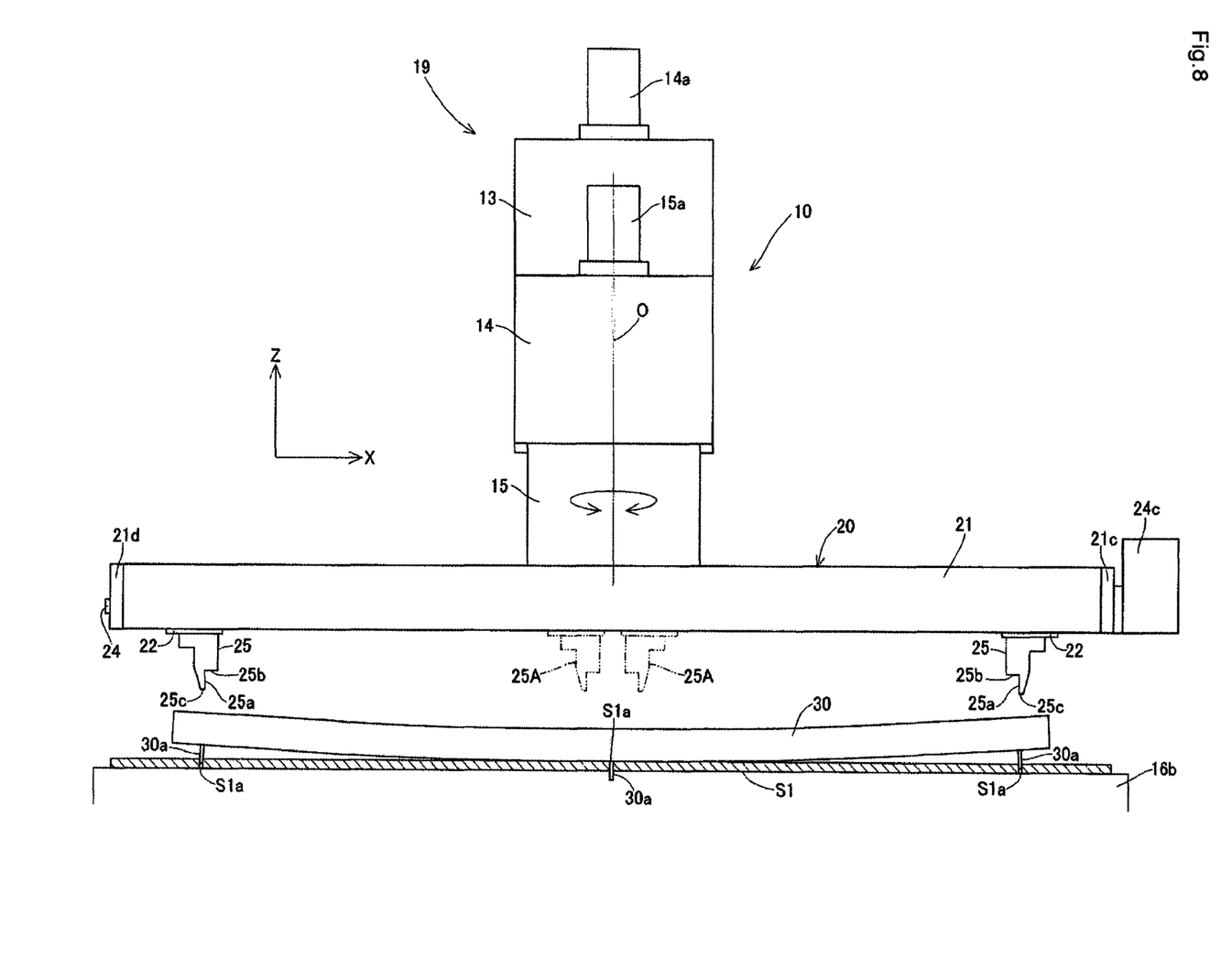
FIG. 8 is a similar front view to that of FIG. 3 of the main parts of the component assembly apparatus in a state in which the component transfer device is raised and rotated by 90°, and holding claws are positioned in positions of a pressing step.

In a subsequent Step S104 (the pressing step and the pressing section), the control device 40 opens the holding claws 25 and 25 using the driving device A, and after raising the component gripping device 20 by releasing the gripping of the component 30 by the holding claws 25 and 25, rotates the component gripping device 20 by 90° using the θ-axis motor 15a so that the component gripping device 20 is parallel with the component 30 (refer to FIG. 8).

Further, the control device 40 performs positioning of each holding claw 25 and 25 in positions (equivalent to "predetermined positions that differ from the positions at which the target gripping location is gripped"), which differ from positions in which the target gripping location of the component 30 is gripped (positions that are shown by two-dotted chain lines 25B and 25B in FIG. 8), and which are shown by solid lines, so that each tip end surface 25c and 25c is directly above each pin 30a and 30a of the both side sections of the component 30, using the driving device A. If necessary at this time, the component gripping device 20 is moved slightly in the X direction and the Y direction. Additionally, the predetermined positions that differ from the positions at which the target gripping location is gripped, refer to a position of each holding claw 25 and 25, which correspond to pressing force positions that are established in advance, and which differ from positions at which a pressing force is applied in a step (the transfer pressing step) in which a pressing force is applied to the component in a state in which the component is gripped.

Further, the control device 40 simultaneously applies a pressing force to the upper surfaces of the both side sections of the component 30, which are directly above each pin 30a and 30a of the both side sections of the component 30, using the tip end surfaces 25c and 25c of each holding claw 25 and 25 by lowering the component gripping device 20, and simultaneously press-fits each pin 30a and 30a of the both side sections of the component 30 to each corresponding positioning hole S1a and S1a of the board S1. The pressing step is completed as a result of this, the lower surfaces of the both side sections of the component 30 also completely abut against the upper surface of the board S1 in a practical sense, and the pins 30a of the both side sections of the component 30 are assembled as a result of being completely inserted into the corresponding positioning holes S1a of the board S1 (refer to FIG. 9).

Figure 9:
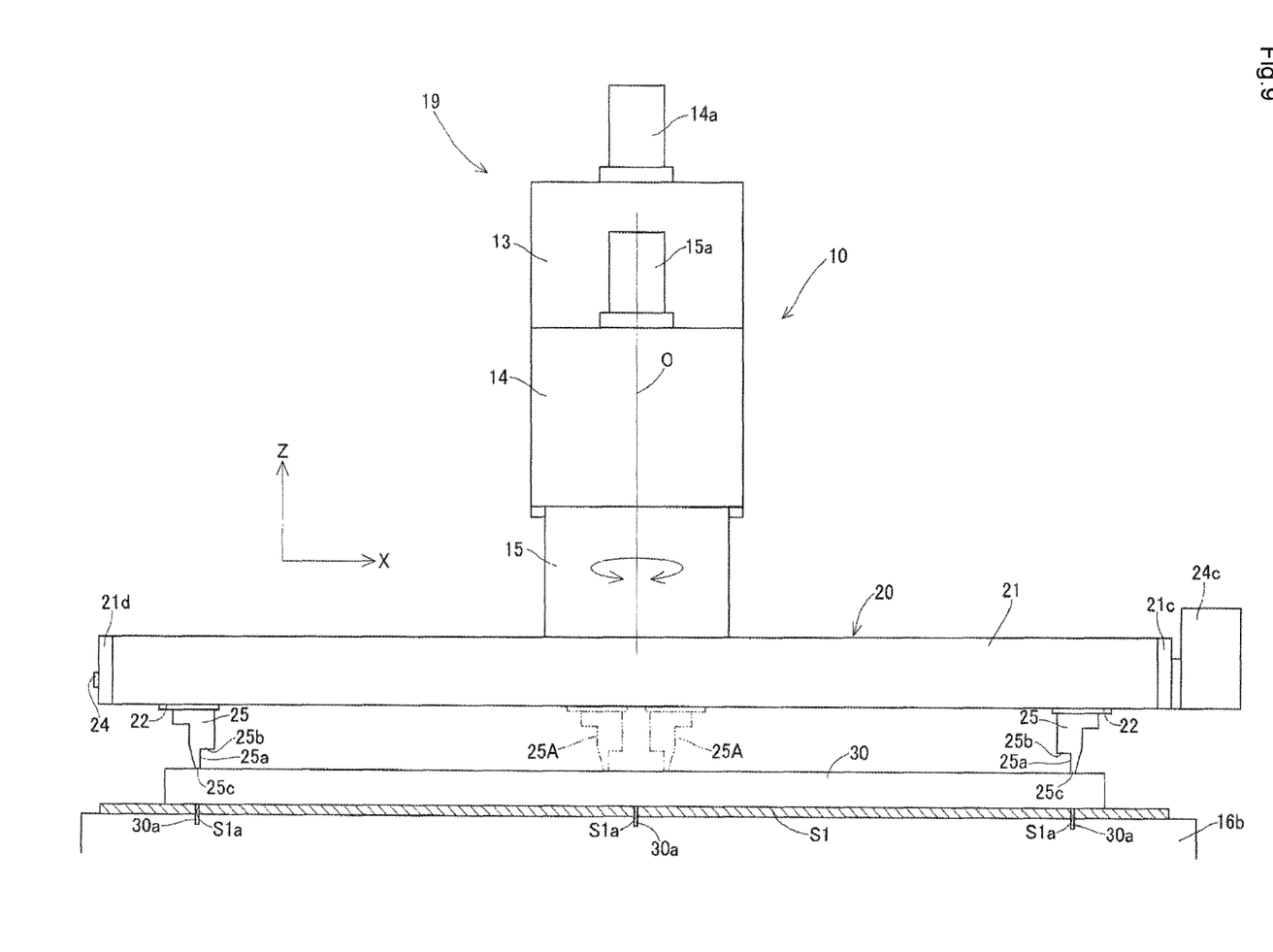
FIG. 9 is a similar front view to that of FIG. 8 of the main parts of the component assembly apparatus in a state in which the component transfer device is lowered, and the pressing step is completed.

Further, if the control device 40 raises the component gripping device 20, the assembly of the component 30 on the board S1 is completed. The board S1, on which the assembly of the component 30 is completed, is fed to a subsequent step by the first board transport lane 16 as a result of the positioning support by the first back-up device 16b being released, a new board S1, which is fed by the first board conveyance lane 16, is positioned and supported by the first backup device 16b, and the assembly of the component 30 for a subsequent component 30 is initiated.

The component 30 is also assembled in the same manner on a board S2, which is positioned and supported by the second back-up device 116b of the second board conveyance lane 116. Additionally, the board S2 may be a type of equipment that differs from the board S1, and the component 30 on which the board S2 is assembled, may also be different.

According to the abovementioned embodiment, in the pressing step, the component 30 is assembled on the board S1 by performing positioning of the two holding claws 25 in positions in which each tip end surface 25c and 25c is directly above each pin 30a and 30a of the both side sections of the component 30 using the driving device A thereof, simultaneously applying a pressing force to the upper surfaces of the both side sections of the component 30 using the tip end surfaces 25c and 25c of each holding claw 25 and 25 by lowering the component gripping device 20, and simultaneously press-fitting each pin 30a and 30a of the both side sections of the component 30 to each corresponding positioning hole S1a and S1a of the board S1. Accordingly, since an assembly time per single assembly location in the pressing step is half that of the case of the abovementioned PTL 1, the cycle time that is required in order to assemble a component on a board is reduced, and therefore, it is possible to improve productivity.

Additionally, in the abovementioned embodiment, positioning of the two holding claws 25 and 25 in positions at which each tip end surface 25c and 25c thereof is directly above each pin 30a and 30a of the component 30 is performed by the driving device A, and a pressing force is applied to the upper surface of the component 30 by each tip end surface 25c and 25c, but substantially the same effect is obtained even if the pressing force positions above the component 30 are positions that are slightly shifted sideways from directly above each pin 30a and 30a. In addition, as shown in FIGS. 6 to 9, substantially the same effect is obtained even if the upper surfaces of the both end sections of the component 30 are press-fitted by the press-down stepped portions 25b of the holding claw 25 in a case in which press-fitting pins 30a are provided close to the both end sections of a long and thin component 30.

In addition, in the abovementioned embodiment, a case in which there are respectively three pairs of the pins 30a, which are provided on the component 30, and the positioning holes S1a, which are provided on the board S1 and to which the pins 30a are press-fitted, and there are two holding claws 25, was described, but the embodiment can also be applied to a case in which there are three or more holding claws 25.

In addition, in the present embodiment, the central section of the component 30 is assembled in the transfer pressing step by gripping the central section of the component 30 using the holding claws 25 of the component gripping device 20, and press-fitting the pins 30a of the central section to the corresponding positioning holes S1a of the board S1, but the both end sections of the component 30 may be assembled in the transfer pressing step by opening the holding claws 25 and 25 widely without rotation thereof, gripping across the both end sections of the component 30 from the outer sides thereof, and press-fitting the pins 30a and 30a of the both sides to the corresponding positioning holes S1a and S1a of the board S1. According to this configuration, since the step is completed by performing opening and closing control of the component gripping device 20 only without rotating the component gripping device 20, it is possible to further reduce the cycle time.

In addition, in the abovementioned embodiment, description of an example in which each pin 30a is provided protruding from the lower surface of the component 30 and each positioning hole S1a is provided in the board S1 is given, but the present embodiment is not limited to this, and can also be applied to an example in which each pin 30a is provided protruding from the upper surface of the board S1 and each positioning hole S1a is provided in a lower surface of the component 30.

In addition, in the abovementioned embodiment, description of an example in which a mutually corresponding plurality of pins, which protrude, and plurality of positioning holes are provided on the component and the board, and assembly is performed by press-fitting each pin to each positioning hole, is given, but the present embodiment is not limited to this, and can also be applied to a case in which a flexible, plate-shaped component (for example, a flexible board) is assembled on a board using an adhesive or a bonding agent. In such a case, for example, if the flexible board is attached to the board by gripping a convex section, which is provided in a projecting manner in a central section of an upper surface of the flexible board, adhesion or bonding is incomplete due to peripheral sections lifting up, but it is possible to perform complete adhesion or bonding across the entire surface if adhesion or bonding is performed by gripping the convex section (equivalent to "a target gripping location of the component") of the central section in the transfer pressing step, and a pressing force is subsequently applied to peripheral portions that lifted up (equivalent to "each portion of the component that corresponds to pressing force positions by each holding claw 25 and 25") by the holding claws 25 and 25 in the pressing step. Additionally, the central section of the lower surface of the flexible board is equivalent to "portions of the component that correspond to the target gripping location of the component", and the positions of the holding claws 25 and 25, which correspond to the pressing force positions of peripheral portions that lifted up are equivalent to "predetermined positions that differ from the position at which the target gripping location is gripped".

In the abovementioned manner, the method according to the present embodiment for assembling a component on a board in a component assembly apparatus, is a method for assembling a component on a board in the component assembly apparatus 10, which is provided with the component transfer devices 19 and 119 that include at least two holding claws 25, opening and closing control of which is performed by the driving device A, which grip the component 30, and that assemble the component 30 by gripping the component 30 using the holding claws 25 and moving the component 30 to an assembly position of the boards S1 and S2, which are positioned in stop positions, includes a transfer pressing step (Step S102) that assembles a portion of the component 30 that corresponds to a target gripping location on the board S1 by applying a pressing force to the component 30 toward board S1 and S2 sides after moving the component 30 above the assembly position in a state in which the target gripping location of the component 30 is gripped by the holding claws 25, and a pressing step (Step S104) that assembles each portion of the component 30 that corresponds to a pressing force position by each holding claw 25 on the boards S1 and S2 by applying a pressing force to the component 30 toward the board S1 and S2 sides using the holding claws 25, opening and closing control of which is performed by the driving device A, and which are positioned in predetermined positions that differ from positions at which the target gripping location is gripped after the transfer pressing step.

As a result of this, a portion of the component 30 that corresponds to the target gripping location is assembled on the board S1 in the transfer pressing step (Step S102) by gripping the target gripping location of the component 30 using at least two holding claws 25, and each portion of the component 30 that corresponds to pressing force positions by each holding claw 25 is assembled on the board S1 in the subsequent pressing step (Step S104) by applying a pressing force to portions of the component 30 that correspond to pressing force positions by each holding claw 25 toward the board S1 side using each holding claws 25, opening and closing control of at least the two holding claws 25 is performed by the driving device A, and which are positioned in predetermined positions that differ from positions at which the target gripping location is gripped. As a result of this, each of at least two holding claws 25, which are positioned in predetermined positions that differ from positions at which the target gripping location of the component 30 is gripped, apply a pressing force to at least two portions of the component 30 that respectively correspond to each holding claw 25 using a single pressing step, and therefore, it is possible to simultaneously assemble each portion in corresponding positions of the board S1. Accordingly, since it is possible to reduce an assembly time per single assembly location in the pressing step (Step S104) by at least half or more, the cycle time that is required in order to assemble a component on a board is reduced, and therefore, it is possible to improve productivity.

In addition, in the method according to the present embodiment for assembling a component on a board in a component assembly apparatus, a plurality of pins 30a, which protrude, or a plurality of positioning holes S1a are provided on a lower surface of the component 30, a plurality of positioning holes S1a or a plurality of pins 30a, that mutually correspond to the respective plurality of pins 30a, which protrude, or the plurality of positioning holes S1a that are provided on the component 30, are provided on an upper surface of the boards S1 and S2, and the transfer pressing step (Step S102) press-fits one of, or the plurality of pins 30a, or one of, or the plurality of positioning holes S1a of the component 30, which correspond to the target gripping location of the component 30 by the holding claws 25, to the positioning holes S1a, or the pins 30a of the boards S1 and S2 that correspond to the one of, or the plurality of pins 30a, or one of, or the plurality of positioning holes S1a of the component 30, which correspond to the target gripping location, by applying a pressing force to the upper surface of the component 30 as a result of lowering the component 30 after moving the component 30 to a predetermined position at which each pin 30a or each positioning hole S1a of the component 30 is aligned with each positioning hole S1a or each pin 30a of the boards S1 and S2 in a state in which the component 30 is gripped by the holding claws 25, and the pressing step (Step S104) press-fits each pin 30a, or each positioning hole S1a of the component 30, which correspond to pressing force positions by each holding claw 25, to each positioning hole S1a, or each pin 30a of the boards S1 and S2, which correspond to the pressing force positions, by applying a pressing force to the upper surface of the component 30 as a result of lowering the component 30 after performing positioning of each holding claw 25 in predetermined positions that differ from the positions that correspond to the target gripping location by performing opening and closing control using the driving device A after the transfer pressing step (Step S102).

According to this configuration, in the transfer pressing step (Step S102), one of, or the plurality of pins 30a, or one of, or the plurality of positioning holes S1a of the component 30, which correspond to the target gripping location of the component 30 by the holding claws 25, are press-fitted to the positioning holes S1a, or the pins 30a of the boards S1 and S2 that correspond to the one of, or the plurality of pins 30a, or one of, or the plurality of positioning holes S1a of the component 30, which correspond to the target gripping location, by gripping the target gripping location of the component 30 using at least the two holding claws 25. In the subsequent pressing step (Step S104), each portion of the component 30 that corresponds to the pressing force positions by each holding claw 25 is assembled on the board S1 by press-fitting each pin 30a, or each positioning hole S1a of the component 30, which correspond to the pressing force positions by each holding claw 25, to each positioning hole S1a, or each pin 30a of the boards S1 and S2, which correspond to the pressing force positions, by applying a pressing force to the upper surface of the component 30 as a result of lowering the component 30 after performing positioning of the holding claws 25 in predetermined positions that differ from the positions that correspond to the target gripping location by performing opening and closing control using the driving device A. As a result of this, each of at least two holding claws 25, which are positioned in predetermined positions that differ from positions at which the target gripping location of the component 30 is gripped, applies a pressing force to at least two portions of the component 30 that respectively correspond to each holding claw 25 using a single pressing step, and therefore, it is possible to simultaneously assemble both portions in corresponding positions of the board S1. Accordingly, since it is possible to reduce an assembly time per single assembly location in the pressing step by half, or more than half, the cycle time that is required in order to assemble a component on a board is reduced, and therefore, it is possible to improve productivity. Additionally, two or more pressing forces may be included in the pressing step in addition to a single pressing force. That is, it is preferable that a single press-fitting action is repeated until all of the pins are completely press-fitted to the positioning holes.

In addition, in the method according to the present embodiment for assembling a component on a board in a component assembly apparatus, the holding claws 25 are configured so as to press-fit upper surface positions of the component 30, which correspond to the pins 30a or the positioning holes S1a, in the abovementioned transfer pressing step and pressing step. If such a configuration is used, since the holding claws 25 press-fit the upper surface positions of the component 30, which corresponds to the pins 30a or the positioning holes S1a, it is possible to assemble the component 30 on the board S1 by reliably press-fitting all of the pins 30a or the positioning holes S1a of the component 30 to all of the corresponding positioning holes S1a or the pins 30a of the board S1.

In addition, in the method according to the present embodiment for assembling a component on a board in a component assembly apparatus, the component gripping device 20 that is provided with the holding claws 25 is configured so as to capable of rotating in a horizontal direction in the above mentioned transfer pressing step and pressing step. If such a configuration is used, it is possible to increase the degrees of freedom of work when gripping the component 30 or press-fitting the upper surface of the component 30 using the holding claws 25.

In addition, the component assembly apparatus 10 according to the present embodiment which includes a component transfer device 19 that includes at least two holding claws 25, which grip the component 30, opening and closing control of which is performed by the driving device A, and that assembles the component 30 by gripping the component 30 using the holding claws 25 and moving the component to an assembly position of the boards S1 and S2, which are positioned in stop positions, is provided with a transfer pressing section (the control device 40 and Step S102) that assembles a portion of the component 30 that corresponds to a target gripping location on the boards S1 and S2 by applying a pressing force toward board S1 and S2 sides after moving the component 30 above the assembly position in a state in which the target gripping location of the component 30 is gripped by the holding claws 25, and a pressing section (the control device 40 and Step S104) that assembles portions of the component 30 that correspond to pressing force positions by each of the holding claws 25 on the boards S1 and S2 by applying a pressing force to the component 30 toward the board S1 and S2 sides using each holding claw 25, by performing opening and closing control by the driving device A, and which are positioned in predetermined positions that differ from positions that correspond to the target gripping location after a process step that assembles a portion of the component 30 that corresponds to the target gripping location on the boards S1 and S2. According to this configuration, it is also possible to obtain the same functional effect as the functional effect as a result of the abovementioned method for assembling a component on a board in the abovementioned component assembly apparatus.

2) Second Embodiment

Figure 10:
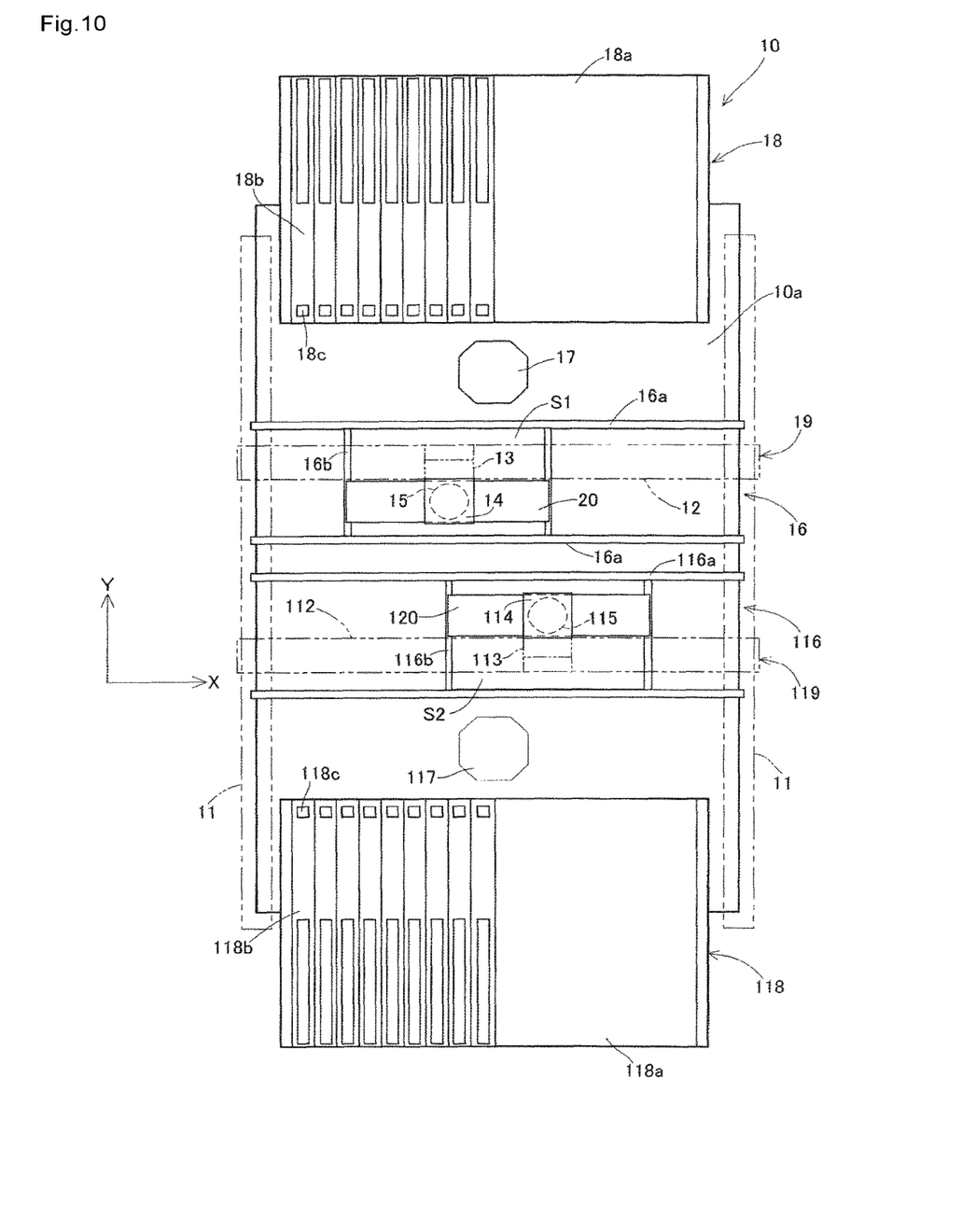
FIG. 10 is a plan view that shows an overall configuration of a second embodiment of a component assembly apparatus according to the present disclosure.

Next, a second embodiment that is shown in FIG. 10 will be described. The component assembly apparatus 10 of the second embodiment is provided with two component transfer devices 19 and 119 that assemble the component 30 on a single board S1 (or S2) by cooperating, the transfer pressing step is implemented by the first component transfer device 19 (one component transfer device), and the pressing step is implemented by the second component transfer device 119 (another component transfer device). The two component transfer devices 19 and 119 both have the same configuration as the component transfer device 19 of the first embodiment that was described earlier, and are provided on a shared guide member 11.

Furthermore, actions (a technique) of a case in which the same component 30 as that described in the first embodiment is assembled on the board S1, which is positioned and supported on the first back-up device 16b of the first board conveyance lane 16, by the component assembly apparatus 10 that is shown in FIG. 10 will be described. Firstly, in Step S102 (the transfer pressing step), the control device 40 moves and lowers the first component gripping device 20 (one component gripping device) to above the first or the second component supply device 18 and 118, grips, unloads and raises a defined component 30 using the holding claws 25 of the first component gripping device 20, and moves the component 30 above the board S1 that is positioned and supported on the first back-up device 16b by moving the component 30 in the X direction and the Y direction. Further, the control device 40 moves the first component gripping device 20 to a predetermined position at which each pin 30a of the gripped component 30 is aligned with the corresponding positioning hole S1a of the board S1, positions and lowers the first component gripping device 20, and completes the transfer pressing step by assembling the component 30 on the board S2. In this state, the component 30 is assembled on the board S1 as a result of the pins 30a of the component 30, which are in the target gripping location by the holding claws 25 being completely press-fitted into the corresponding positioning holes S1a of the board S1, but each pins 30 of locations other than the target gripping location of the component 30 are not completely press-fitted into the corresponding positioning holes S1a of the board S1, and portions of the component 30 that correspond to these pins 30a attains a state of being lifted up from the surface of the board S1. In this state, the component gripping device 20 is withdrawn from above the board S1 to a first component supply device 18 side.

In the subsequent Step S104 (the pressing step), firstly, the control device 40 moves a second component gripping device 120 (another component gripping device) above the board S1, which is positioned and supported on the first back-up device 16b as a result of moving the second component gripping device 120 in the X direction and the Y direction. Further, the control device 40 moves and positions each holding claw 25 and 25 in a position in which each holding claw 25 and 25 is aligned with portions in which each pin of the component 30, which is moved over the board S1 by Step S102 (the transfer pressing step), of locations other than the target gripping location is provided, and if the second component transfer device 120 is lowered, pins that were not completely press-fitted to the positioning holes in Step S102 (the transfer pressing step) are press-fitted into the corresponding positioning holes. In a case in which all of the pins are not press-fitted, the control device 40 repeats the pressing step until all of the pins are press-fitted. As a result of this, the assembly of the component 30 on the board S2, which is positioned and supported on the second back-up device 116b of the second board conveyance lane 116, is completed.

Additionally, it is preferable that each holding claw 25 and 25 is moved and positioned in a position in which each holding claw 25 and 25 is aligned with portions in which each pin of the component 30 of locations other than the target gripping location is provided, by performing opening and closing control using the driving device A in parallel with Step S102 (the transfer pressing step) before, firstly, the second component gripping device 120 (another component gripping device) is moved above the board S1, which is positioned and supported on the first back-up device 16b as a result of moving the second component gripping device 120 in the X direction and the Y direction in Step S104 (the pressing step). According to this configuration, it is possible to further reduce the cycle time. It is also possible to perform assembly of the component 30 on the board S1, which is positioned and supported by the second back-up device 116b of the second board conveyance lane 116, in the same manner using the component assembly apparatus 10 that is shown in FIG. 10.

In the method according to the present embodiment for assembling a component on a board in a component assembly apparatus, the component assembly apparatus 10 is provided with two component transfer devices (the first and second component transfer devices 19 and 119) that assemble the component 30 on a single board S1 or S2 by cooperating, and the abovementioned transfer pressing step is implemented by one component transfer device 19, and the abovementioned pressing step is implemented by another second component transfer device 119. According to this configuration, since it is possible to perform preparation (rotation and opening and closing control of the component gripping device 20) of another second component transfer device 119 in order to implement the pressing step during implementation of the transfer pressing step by one component transfer device 19, the cycle time that is required in order to assemble a component on a board is further reduced, and therefore, it is possible to further improve productivity.

REFERENCE SIGNS LIST

10 . . . component assembly apparatus, 19 . . . first component transfer device (one component transfer device), 119 . . . second component transfer device (another component transfer device), 20, 120 . . . component gripping device, 25 . . . holding claw, 30 . . . component, 30a . . . pin, 40 . . . control device (transfer pressing section and pressing section), A . . . driving device, S1, S2 . . . board, S1a . . . positioning hole

[FIG. 4]
16, 116: BOARD CONVEYANCE DEVICE
16b, 116b: BACK-UP DEVICE
17, 117: COMPONENT IMAGING DEVICE
18, 118: COMPONENT SUPPLY DEVICE
19 (119): COMPONENT TRANSFER DEVICE
A: DRIVING DEVICE (COMPONENT GRIPPING DEVICE)
40: CONTROL DEVICE
41: INPUT DEVICE
42: BOARD IMAGING DEVICE
43: STORAGE DEVICE
44: OUTPUT DEVICE
[FIG. 5]
START
S102: MOVEMENT OF COMPONENT AND APPLICATION OF PRESSING FORCE WITH COMPONENT HELD (TRANSFER PRESSING STEP)
S104: OPENING OF HOLDING CLAWS AND APPLICATION OF PRESSING FORCE (PRESSING STEP)
END

The invention claimed is:

1. A method for assembling a component on a board in a component assembly apparatus, which is provided with a component transfer device that includes at least two holding claws, which grip a component, opening and closing control of which is performed by a driving device, and that assembles the component by gripping the component using the holding claws and moving the component to an assembly position of the board, which is positioned in a stop position, the method comprising:

a transfer pressing step that assembles a portion of the component that corresponds to a target gripping location of the component on the board by applying a pressing force toward a board side after moving the component above the assembly position in a state in which the target gripping location of the component is gripped by the holding claws; and a pressing step that opens the holding claws to release gripping of the component, that moves each of the holding claws to respective portions of the component that correspond to pressing force positions which are predetermined positions that differ from positions at which the target gripping location is gripped after the transfer pressing step, and that assembles the portions of the component that respectively correspond to the pressing force positions of each holding claw on the board by applying a pressing force to the component toward the board side using each holding claw.

2. The method for assembling a component on a board in a component assembly apparatus according to claim 1,
wherein a plurality of pins, which protrude, or a plurality of positioning holes are provided on a lower surface of the component,
a plurality of positioning holes or a plurality of pins, which protrude, that mutually correspond to the respective plurality of pins, which protrude, or the plurality of positioning holes that are provided on the component, are provided on an upper surface of the board,
the transfer pressing step press-fits one of, or the plurality of pins, or one of, or the plurality of positioning holes of the component, which correspond to the target gripping location of the component by the holding claws, to the positioning holes, or the pins of the board that correspond to the one of, or the plurality of pins, or one of, or the plurality of positioning holes of the component, which correspond to the target gripping location, by applying a pressing force to the upper surface of the component as a result of lowering the component after moving the component to a predetermined position at which each pin or each positioning hole of the component is aligned with each positioning hole or each pin of the board in a state in which the component is gripped by the holding claws, and
the pressing step press-fits each pin, or each positioning hole of the component, which correspond to pressing force positions by the holding claws, to each positioning hole, or each pin of the board, which correspond to the pressing force positions, by applying a pressing force to the upper surface of the component as a result of lowering the component after performing positioning of the holding claws in predetermined positions that differ from the positions that correspond to the target gripping location by performing opening and closing control using the driving device after the transfer pressing step.

3. The method for assembling a component on a board in a component assembly apparatus according to claim 2,
wherein, in the transfer pressing step and the pressing step, the holding claws press-fit upper surface positions of the component that correspond to the pins or the positioning holes.

4. The method for assembling a component on a board in a component assembly apparatus according to claim 1,
wherein, in the transfer pressing step and the pressing step, the holding claws are capable of rotating in a horizontal direction.

5. The method for assembling a component on a board in a component assembly apparatus according to claim 1,
wherein the pressing step also rotates the holding claws by 90° after releasing the component and separates the holding claws from each other to move the claws to the pressing force positions located at opposite ends of the component.

6. A method for assembling a component on a board in a component assembly apparatus, which is provided with a component transfer device that includes at least two holding claws, which grip a component, opening and closing control of which is performed by a driving device, and that assembles the component by gripping the component using the holding claws and moving the component to an assembly position of the board, which is positioned in a stop position, the method comprising:
a transfer pressing step that assembles a portion of the component that corresponds to a target gripping location of the component on the board by applying a pressing force toward a board side after moving the component above the assembly position in a state in which the target gripping location of the component is gripped by the holding claws; and
a pressing step that assembles each portion of the component that corresponds to a pressing force position by each of the holding claws on the board by applying a pressing force to the component toward the board side using the holding claws, opening and closing control of which is performed by the driving device, and which are positioned in predetermined positions that differ from positions at which the target gripping location is gripped after the transfer pressing step,
wherein the component assembly apparatus is provided with two component transfer devices, which assemble the component on a single board by cooperating, and
the transfer pressing step is implemented by one component transfer device, and the pressing step is implemented by the other component transfer device.

7. A component assembly apparatus which is provided with a component transfer device that includes at least two holding claws, which grip a component, opening and closing control of which is performed by a driving device, and that assembles the component by gripping the component using the holding claws and moving the component to an assembly position of the board, which is positioned in a stop position, the component assembly apparatus comprising:
a transfer pressing section that assembles a portion of the component that corresponds to a target gripping location on the board by applying a pressing force toward a board side after moving the component above the assembly position in a state in which the target gripping location of the component is gripped by the holding claws; and
a pressing section that opens the holding claws to release gripping of the component, that moves each of the holding claws to respective portions of the component that correspond to pressing force positions which are predetermined positions that differ from positions that correspond to the target gripping location, and that assembles portions of the component that respectively correspond to the pressing force positions of each holding claw on the board by applying a pressing force to the component toward the board side using each holding claw.

8. The component assembly apparatus according to claim 7,
wherein the pressing section rotates the holding claws by 90° after releasing the component and separates the holding claws from each other to move the claws to the pressing force positions located at opposite ends of the component.

* * * * *